(12) United States Patent
Liu et al.

(10) Patent No.: US 6,350,688 B1
(45) Date of Patent: Feb. 26, 2002

(54) VIA RC IMPROVEMENT FOR COPPER DAMASCENE AND BEYOND TECHNOLOGY

(75) Inventors: Chung-Shi Liu, Hsin-Chu; Shau-Lin Shue, Hsinchu; Chen-Hua Yu, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/629,646

(22) Filed: Aug. 1, 2000

(51) Int. Cl.[7] .................. H01L 21/44; H01L 21/4763
(52) U.S. Cl. .................. 438/687; 438/622; 438/625; 438/626; 438/627; 438/629; 438/633; 438/637; 438/672; 438/675

(58) Field of Search .................. 438/687, 622, 438/623, 624, 625, 626, 627, 628, 629, 631, 632, 633, 634, 637, 638, 663, 672, 675

(56) References Cited

U.S. PATENT DOCUMENTS

| 5,814,557 A | 9/1998 | Venkatraman et al. ...... 438/622 |
| 6,015,749 A | 1/2000 | Liu et al. ...................... 438/628 |
| 6,037,257 A | 3/2000 | Chiang et al. .............. 438/687 |
| 6,043,153 A | 3/2000 | Nogami et al. ............. 438/687 |

*Primary Examiner*—Charles Bowers
*Assistant Examiner*—Thanhha Pham
(74) *Attorney, Agent, or Firm*—George O. Saile; Stephen B. Ackerman

(57) ABSTRACT

A new anneal procedure is provided that is applied to copper damascene via interconnects after copper ECP deposition and prior to copper planarization.

24 Claims, 4 Drawing Sheets

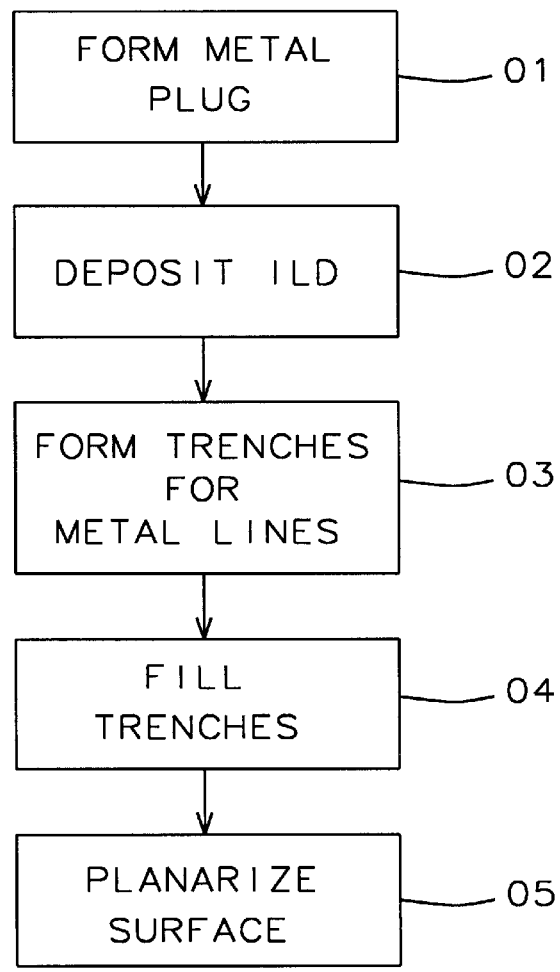
FIG. 1a - Prior Art
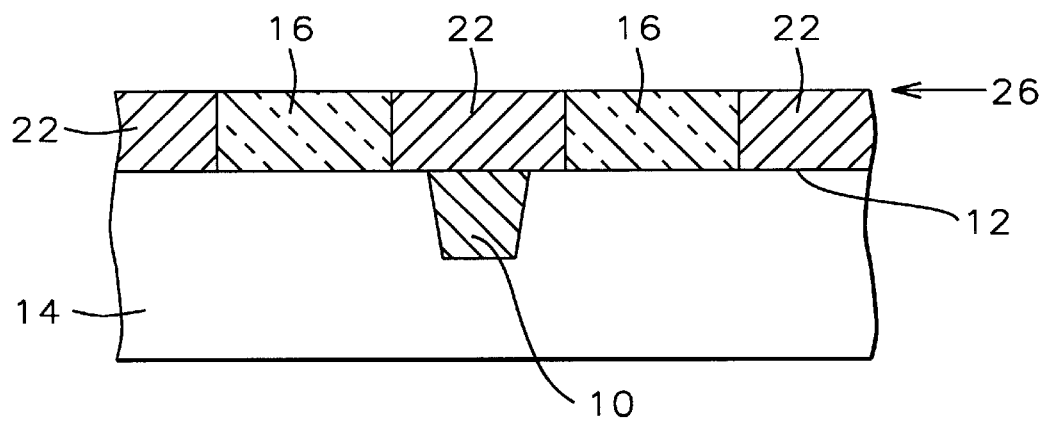
FIG. 1b - Prior Art

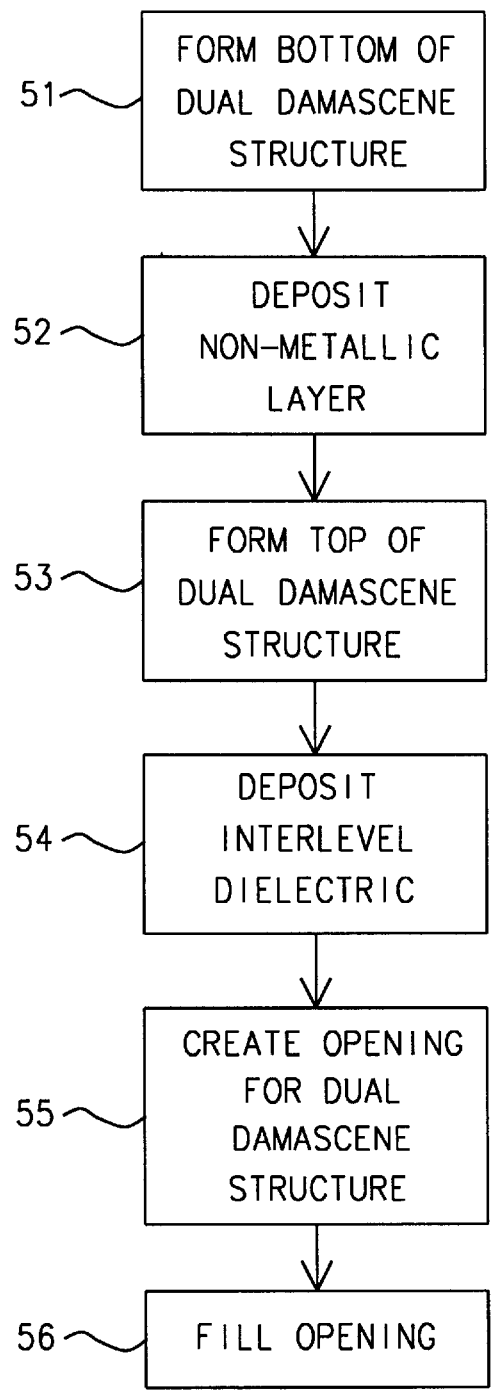
FIG. 2a - Prior Art

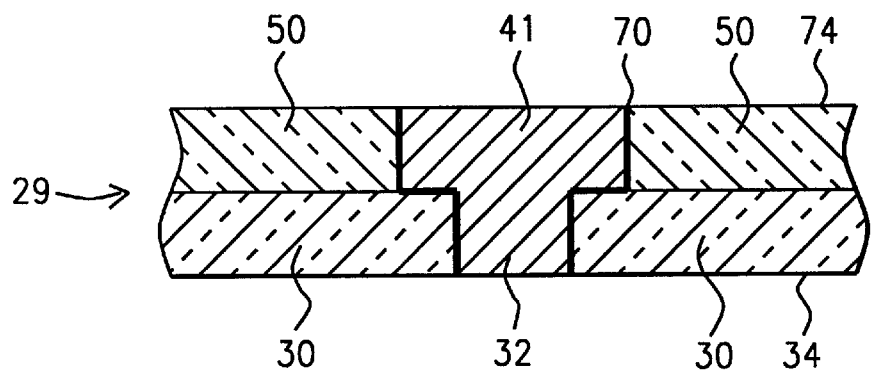
FIG. 2b – Prior Art
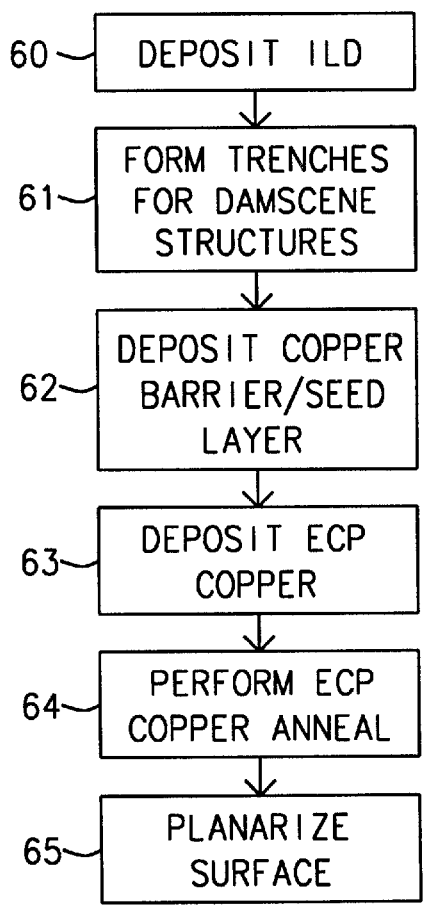
FIG. 3

VIA RC IMPROVEMENT FOR COPPER DAMASCENE AND BEYOND TECHNOLOGY

BACKGROUND OF THE INVENTION (1) Field of the Invention

The invention relates to the fabrication of integrated circuit devices, and more particularly, to a method of reducing the via resistance of copper damascene interconnect plugs.

(2) Description of the Prior Art

In creating very and ultra large scale integration (VLSI and ULSI) semiconductor circuits, one of the more important aspects of this creation is the fabrication of metal interconnect lines and vias that provide the interconnection of integrated circuits in semiconductor devices. The invention specifically addresses the creation of conductive vias using the damascene process.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. Dual damascene is an improvement over single damascene because it permits the filling of both the conductive grooves and vias with metal at the same time, thereby eliminating processing steps. The conventional dual damascene process requires two masking steps to form first the via pattern after which the pattern for the conductive lines is formed.

Using the dual damascene process, an insulating layer or a dielectric layer, such as silicon oxide, is patterned with a multiplicity of openings for conductive lines and vias. The openings are simultaneously filled with a metal, such as aluminum, and serve to interconnect the active and/or the passive elements of an integrated circuit. The dual damascene process is also used for forming multilevel conductive lines of metal, such as copper, in the insulating layers, such as polyimide, of multilayer substrates on which semiconductor devices are mounted. Critical to a good dual damascene structure is that the edges of the via openings in the lower half of the insulating layer are clearly defined. Furthermore, the alignment of the two masks is critical to assure that the pattern for the conductive lines aligns with the pattern of the vias. This requires a relatively large tolerance while the via may not extend over the full width of the conductive line.

FIG. 1a gives an overview of the steps of the damascene process, as follows:

step 01 shows the formation of the metal plug,
step 02 shows the deposition of the Intra-Level Dielectric (ILD),
step 03 shows the formation of the trenches for metal lines,
step 04 shows the deposition of metal to fill the trenches, and
step 05 shows the removal of metal from the surface.

The damascene process is further explained below, the numbers indicated within this explanation refer to the cross section of a damascene structure that is shown in FIG. 1b.

Referring now specifically to FIG. 1a, step 01, there is shown the formation of a metal via plug 10 in the surface of a semiconductor substrate 14 (FIG. 1b). Any micro-scratch in the surface of the substrate 14 will fill with metal during subsequent metal deposition and can cause electrical shorts between adjacent via plugs 10 or between electrical lines deposited on top of surface 12. To remove the damascene residue and to remove the scratch count on the surface 12, surface 12 is polished and buffed after the metal plug 10 has been created.

FIG. 1a, step 02 shows the deposition of the Intra-Level Dielectric (ILD) 16 (FIG. 1b) which can be deposited using Plasma Enhanced CVD (PECVD) technology. Dielectric 16 can, for instance, be $SiO_2$.

FIG. 1a, step 03 shows the formation of the trenches 22 (FIG. 1b) for the metal lines, these trenches 22 can be formed using Reactive Ion Etching (RIE) technology.

FIG. 1a, step 04 shows the deposition of metal to fill the trenches 22, this process can use either the CVD or a metal flow process. The excess metal on the surface 26 is removed using the CMP process, see FIG. 1a, step 05, and a planar structure 26 with metal inlays 22 in the intra-level dielectric 16 is achieved.

For many of the applications of the damascene process, a thin barrier layer is deposited over the inside of the opening for the damascene conducting line (thereby covering the bottom and the sidewalls of this opening) prior to the formation of the damascene conducting line. Frequently used material for this barrier layer is TaN/Ta. This layer of TaN/Ta prevents diffusion of the copper of conducting line into the surrounding dielectric during the formation of the copper conducting line. The barrier layer typically has a thickness of about 300 Angstrom.

In addition, a copper seed layer can be deposited over the surface of the barrier layer, this seed copper facilitates and enhances the formation of the copper conducting line during its deposition. A copper seed layer typically has a thickness of about 1600 Angstrom.

The damascene process, as already indicated above, first etches the conductor pattern into the dielectric after which the etched pattern is filled with metal to create the buried metalization that also has a surface of good planarity. This damascene process also eliminates the need of a dielectric deposition in order to fill the gaps. A planarized metal deposition process can be used for this to fill the pattern that has been created in a dielectric layer of $SiO_2$. An etchback or CMP process will remove the excess metal over the field regions. CMP thereby offers the advantage of providing a globally planarized surface. The indicated processing steps can be applied to both single and dual damascene.

For the dual damascene process, the processing steps can follow three approaches. The dual damascene structure consists of a lower (via plug) part and an upper (interconnect line) part.

Approach 1, the via is created first. This approach uses a double layer stack of dielectric whereby the layers of dielectric are separated by an etch stop layer typically containing SiN. A lowest etch stop layer is deposited over the surface of the substrate on which the dual damascene structure is to be created, this lowest etch stop layer is the etch stop for the via etch. The vias are formed by resist patterning after which an etch through the double layer dielectric stack is performed. This is followed by patterning the conductor (interconnect line) in the top layer of $SiO_2$ thereby using the inter-dielectric etch stop layer of SiN as the etch stop layer.

Approach 2, the conductor first process. The conductor patterns is formed by resist patterning and by etching the conductor patterns into the upper $SiO_2$ layer thereby using the SiN layer as an etch stop layer. This is followed by via resist patterning and etching through the thin layer of SiN and the lower $SiO_2$ layer.

Approach 3, the etch stop layer first. The first $SiO_2$ layer is deposited, followed by the thin layer of SiN as etch stop, followed by the via resist patterning and etching of the SiN layer. This is followed by depositing the top $SiO_2$ layer and then the conductor patterning. In etching the conductor pattern in the top $SiO_2$ layer, the etching process will be stopped by the SiN layer except where the via holes are already opened in the SiN layer thereby completing the via holes etching in the first SiO$_2$ layer simultaneously.

The creation of a dual damascene structure is highlighted by an example as shown in FIGS. 2a and 2b.

FIG. 2a gives and overview of the sequence of steps required of forming a Prior Art dual damascene structure. The numbers referred to in the following description of the formation of the dual damascene structure relate to the cross section of the completed dual damascene structure that is shown in FIG. 2b.

FIG. 2a gives an overview of the sequence of steps required for forming a Prior Art dual damascene structure. The numbers referred to in the following description of the formation of the dual damascene structure relate to the cross section of the completed dual damascene structure that is shown in FIG. 2b.

FIG. 2a, 52 shows the deposition within plane 29 (FIG. 2b) of a layer of non-metallic material such as poly-silicon on top of the first dielectric 30 and across the via 32, filling the via opening 32.

FIG. 2a, 53 shows the formation of the top section 41 of the dual Damascene structure by forming a pattern 41 within the plane of the non-metallic layer in plane 29. This pattern 41 mates with the pattern of the previously formed via 32 (FIG. 2a, 51) but it will be noted that the cross section of the pattern opening 41 in plane 29 of the non-metallic layer is considerably larger than the cross section of the via opening 32 (FIG. 2a, 51). After pattern 41 has been created and as part of this pattern creation step, the remainder of the non-metallic layer 29 is removed, the pattern 41 remains in place at this time.

FIG. 2a, 54 shows the deposition and planarization (down to the surface of pattern 41) of an inter level dielectric (ILD) 50, a poly-silicon can be used for this dielectric.

FIG. 2a, 55 shows the creation of an opening by removing the poly-silicon from the pattern 41 and the via 32. It is apparent that this opening now has the shape of a T and that the sidewalls of the opening are not straight but show a top section that is larger than the bottom section.

FIG. 2a, 56 shows the deposition of a layer of metal over the surface of the layer 50 of ILD and filling the opening 32/41. FIG. 2b shows the cross section of the dual Damascene structure where a barrier 70 has been formed on the sides of the created opening. The opening 32/41 has previously been created by removing the poly-silicon from the pattern 41 and the vias 32. Metal such as tungsten or copper can be used for the processing step of metal deposition.

Copper is a material that has recently gained much attention as a replacement for conventional interconnect metal. Copper as an interconnect material offers low cost and low resistance, copper however has low adhesive strength to various insulating layers and shows an inherent difficulty in masking and etching a blanket copper layer to form intricate circuit structures. Copper further suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. This corrosion may result in loss of adhesion, delamination, voids and ultimately a catastrophic failure of the component. Copper interconnects should therefore be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. A typical barrier layer is deposited using rf. sputtering of titanium nitride, tantalum, tungsten, niobium, molybdenum, Ti/TiN or Ti/W and is more preferably formed from TiN. The barrier layer can also be used to improve the adhesion of a subsequent overlying tungsten layer. A barrier layer is preferably about 100 and 500 angstrom thick and more preferably about 300 angstrom thick.

To further enhance the adhesion of a copper interconnect line to the surrounding layer of dielectric or insulation, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required to achieve a reliable gap fill.

Semiconductor device performance improvements are largely achieved by reducing device dimensions while increasing device-packaging densities. With the continuing shrinkage of integrated circuit device dimensions, one of the major challenges in creating damascene interconnects is the via resistance of these interconnects. The invention addresses this aspect of the damascene process and provides a method that considerably reduces the via resistance of damascene interconnects.

U.S. Pat. No. 6,015,749 (Liu et al.) shows an ECD Cu and an anneal in a vacuum, see col. 4, line 40.

U.S. Pat. No. 6,043,153 (Nogami et al.) teaches an ECD Cu and vacuum anneal, see col. 4, line 12.

U.S. Pat. No. 6,037,257 (Chiang et al.) shows a Cu sputter deposition and anneal.

U.S. Pat. No. 5,814,557 (Venkatraman et al.) shows another ECD and anneal process.

SUMMARY OF THE INVENTION

A principle objective of the invention is to reduce via resistance of damascene interconnects.

Another objective of the invention is to reduce the semiconductor device failure rate that is caused by high damascene via resistance failures.

Yet another objective of the invention is to replace the conventional Electro Chemical Plating (ECP) copper anneal process with an improved process that results in reducing the via resistance of damascene via interconnects.

In accordance with the objectives of the invention a new anneal procedure is introduced that is applied to copper damascene via interconnects after copper ECP deposition and prior to copper planarization.

BRIEF DESCRIPTION OF THE DRAWINGS

FIGS. 1a and 1b show a processing sequence of a damascene process, as follows:

FIG. 1a shows a flow chart of a damascene process,

FIG. 1b shows a damascene structure created using the process that is shown in FIG. 1a.

FIGS. 2a and 2b show a processing sequence of a dual damascene process, as follows:

FIG. 2a shows a flow chart of a dual damascene process,

FIG. 2b shows a dual damascene structure created using the process that is shown in FIG. 2a.

FIG. 3 shows a flow chart of the damascene process of the invention.

FIG. 4a shows a cross section of an opening created through the two layers of dielectric.

FIG. 4b, shows a layer of photoresist that has been deposited and patterned on the surface of an etch stop layer.

FIG. 4c shows a cross section after the etch for the interconnect lines has been completed (creating the dual damascene opening) and after the patterned layer of photoresist and the upper etch stop layer have been removed.

DESCRIPTION OF THE PREFERRED EMBODIMENTS

Figure 4A:
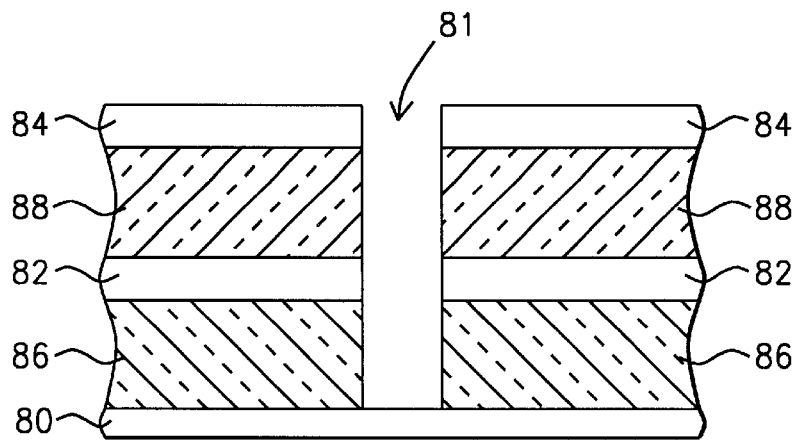
FIGS. 4a through 4c show further detail of the formation of a dual damascene structure, as follows.

Referring now specifically to FIG. 3, there is shown a flow chart of the processing steps of the invention.

The process of the invention starts with a semiconductor substrate in the surface of which have been provided points to which electrical contact must be established. The process of the invention is not limited to a surface of a substrate but can be applied to any other surface within a semiconductor device in which points of electrical contact have been provided.

A layer of intra-level dielectric (ILD) is deposited over the surface of the substrate or any other surface to which electrical contact must be established, FIG. 3, step 60.

The layer of Inter Level Dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

The more commonly used and therefore the preferred dielectric that is used for the layer of ILD are silicon dioxide (doped or undoped), silicon oxynitride, parylene or polyimide, spin-on-glass, plasma oxide or LPCVD oxide.

The deposition of the layer ILD uses conventional deposition technology and can, for instance, be deposited using PECVD procedures at a temperature of between about 350 and 450 degrees C. to a thickness between about 5000 and 10,000 Angstrom using, for instance, TEOS as a source.

The intra-dielectric material that is typically used to isolate conducting lines from each other is silicon dioxide, which is a thermally and chemically stable material. Continued decreasing of the horizontal dimensions of semiconductor devices leads to layers of metal that tend to have vertical dimensions that are not necessarily reduced accordingly, resulting for instance in contact and via openings that have a high aspect ratio. Conventional oxide etching processes and materials are however available for such high aspect ratio contact and via openings. A typical application of depositing a layer of ILD using $SiO_2$ applies CVD technology at a temperature of between about 400 and 800 degrees C. The layer is, after it has been deposited, polished using CMP technology.

After the layer of ILD has been deposited and polished, trenches are formed in the layer of dielectric for either the damascene structure or a dual damascene structure, FIG. 3, step 61. The trenches are etched using standard photolithography and RIE procedures such as applying, for example, the preferred etching conditions for etching a layer of TEOS, which are using $CF_4$ or $CHF_3$ as an etchant gas at a flow rate of about 15 sccm, a gas pressure about 800 mTorr, rf power density about 400 Watts, ambient wafer temperature, time of the etch about 10 seconds.

Figure 4B:
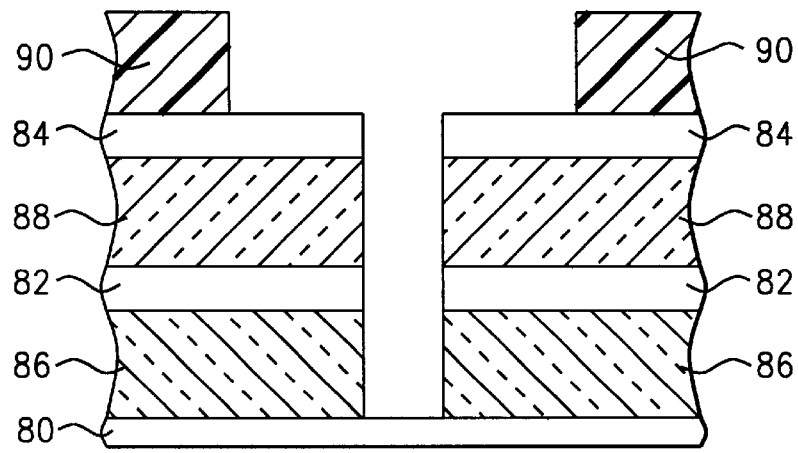
Figure 4C:
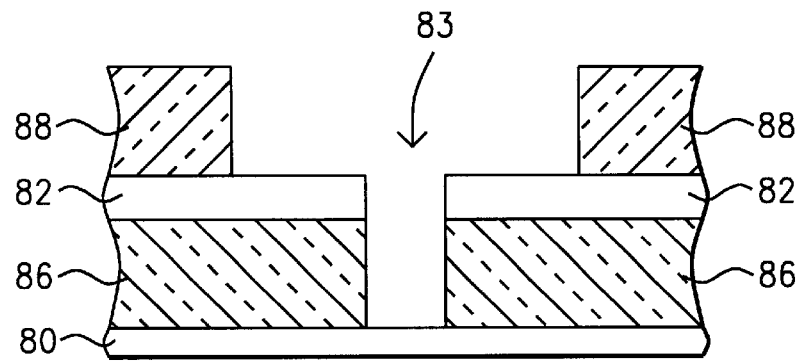

FIGS. 4a through 4c show further detail of the formation of a dual damascene structure. FIG. 4a shows a cross section of the opening 81 that has been created through the two layers of dielectric 86 and 88. Layer 80 is an etch stop layer that has been deposited prior to the formation of the first layer of dielectric 86. This layer is typically deposited to a thickness of 500 Angstrom and can contain SiON. Layer 80 is the etch stop layer for etching the opening 81. Over layer 86 of dielectric a second etch stop layer 82 is deposited, typically to a thickness of about 300 Angstrom while this layer also can contain SiON. This stop layer 82 serves as the stop for the etching of the interconnect line pattern that forms the top section of the profile of the dual damascene structure. A second layer 88 of dielectric is deposited over the second etch stop layer 82. A final layer 84 is deposited over the surface of the second dielectric 88, this layer can contain SiON and serves as a stress relieve layer over the dielectric layer 88. The lower section (roughly below the top surface of the second stop layer 82) of opening 81 forms the plug section of the dual damascene structure, the upper section (roughly above the top surface of the second stop layer 82) needs to be widened (etched) in order to form the interconnect pattern of the dual damascene structure. The stop layers 80, 82 and 84 of SiON can be formed to a thickness of about 650 angstrom through a CVD method employing silane as a silicon source material and ammonia as a nitrogen source material.

FIG. 4b, shows how a layer 90 of photoresist has been deposited over the surface of the stop layer 84. Photoresist layer 90, deposited to a thickness of about 8000 Angstrom, forms a positive photoresist material and is deposited over the surface of layer 84 and patterned to created the top profile of the dual damascene structure. The second layer of dielectric 68 can now be etched.

In the formation of a dual damascene structure, use can also be made of a layer of Anti Reflective Coating (ARC) (not shown in FIG. 4) that is deposited inside opening 81 and over the top surface of layer 94 of SiON. Increased Circuit density often brings with it the need to create openings that have a high aspect ratio. For high aspect ratio openings, it is critical that openings are created that have a profile that allows for complete penetration of the metal that fills the opening while the profile of the opening is such that good adhesion is established between the deposited metal and the sidewalls of the opening. To avoid distortion of the photoresist patterns that are used to create the openings on the dielectric layer, Anti Reflective Coating (ARC) is frequently applied over the surface of the opening. Photolithographic patterning problems can be caused by the increase in use of highly reflective materials such as polysilicon, aluminum, and metal silicides in the creation of the semiconductor device. These materials can cause unwanted reflections from the underlying layers resulting in distortion of the creation of the openings. Anti-reflective coatings (ARC's) are used to minimize the adverse impact due to reflectance from these reflective materials. In many instances, these ARC's are conductive materials which are deposited as a blanket layer on top of metal and simultaneously patterned with the metal to form interconnects. A problem with these ARC's is that many of the metals cannot be used in applications such as dual damascene, wherein the metal layer is not patterned. As previously indicated, in dual damascene application, openings are formed in the interlayer dielectric, and the metal is blanket deposited in those openings and subsequently polished back to form a planar inlaid plug. In such application, the metal layer is never etched and therefore, any conductive ARC combined with the inlaid metal would cause the metal plugs to be electrically short-circuited together through the conductive ARC. A layer of ARC further serves the function of protecting the etch stop layer 80 at the bottom of the opening 81. The ARC layer also allows, due to its protective nature, for a decrease in the thickness of layer 80, whereby layer 80 continues to serve as a stop layer during the first etch (to create opening 81 and with it, the lower section of the dual damascene structure). The deposition of a layer ARC further allows for a decrease in the thickness of the Intra-Level Dielectric (ILD) layer 88 thereby providing a level of control over the profile of the created opening of the dual damascene structure.

FIG. 4c shows a cross section after the etch for the interconnect lines has been completed, creating the dual damascene opening 83. The patterned layer 90 of photoresist and the top layer 84 of etch stop have been removed from the surface of the dielectric layer 88. Opening 83 is now ready for further processing such as the deposition of barrier and seed layers and the filling of opening 83 with a metal.

Returning now to FIG. 3, after the damascene trenches have been formed in the layer of dielectric, the process of the invention continues with depositing of a barrier layer over which a seed layer is deposited, FIG. 3, step 62. The barrier layer is deposited over the surface of the layer of ILD thereby including the inside surfaces of the trenches that have been etched for the damascene structures. The barrier layer may be deposited by reactive sputtering or by CVD. As device features shrink in size, the CVD method of forming a barrier layer becomes essential. CVD processes are preferred because they can provide conformal layers of any thickness. Thinner barrier layers are preferred because of the shrinking feature sizes.

A typical barrier layer is formed of titanium nitride, tantalum, tungsten, niobium, molybdenum, Ti/TiN or Ti/W and is more preferably formed from TiN. A typical diffusion barrier layer may further contain silicon nitride, phosphosilicate glass (PSG), silicon oxynitride, aluminum, aluminum oxide ($Al_xO_y$). A barrier layer is preferably about 100 and 500 angstrom thick and more preferably about 300 angstrom thick.

Seed layers are used in the art to form fine geometry lines that serve as the electroplating base for conductor lines having fine geometry. After the barrier layer has been deposited as indicated above, a seed layer is deposited over the surface of the barrier layer. Typical processing conditions for the deposition of a seed layer are as follows: a sputter chamber or an Ion Metal Plasma (IMP) chamber is used at a temperature of between about 0 and 300 degrees C. and a pressure of between about 1 and 100 mTorr, using copper or a copper alloy as the source (as highlighted above) at a flow rate of between about 10 and 400 sccm and using argon as an ambient gas.

After the barrier and seed layers have been created, the copper is deposited thereby filling the trenches that have been created for the damascene structures, FIG. 3, step 63. The copper is deposited overlying the seed layer and is deposited using Electro Chemical Plating (ECP). Typical ECP processing parameters are as follows: temperature between about 25 and 50 degrees, the source of deposition of the $H_2SO_4$ is the dilution of $H_2SO_4$, $CuSO_4$ and HCl with a deposition flow rate of between about 15 K and 20 K sccm and a deposition time of between about 1 and 10 minutes, the voltage applied to the anode between about 0.1 and 2 volts and the voltage applied to the cathode between about 0.1 and 2 volts.

The ECP process creates the metal plug in a well-controlled manner due to the fact that ECP Cu deposits Cu only on places that have a Cu seed, without the Cu seed the ECP bath does not deposit Cu.

After the copper metal plugs have been created, FIG. 3, step 63, a ECP copper anneal is performed which is critical to the process of the invention, FIG. 3, step 64. This anneal exposes the surface of the substrate on which the damascene structures are being formed to a temperature of about 200 degrees C., for a duration of about 1 minute, in a high vacuum environment that has a pressure of less than about 1E-5 Torr. This anneal of the invention replaces the conventional surface anneal of the deposited copper and has been found to dramatically reduce the failure rate that is attributable to via plug resistance, whereby the failure rate has been reduced from between about 30 and 100% to between about 0 and 2%. This high vacuum anneal of the invention has, for all practical purposes, reduced the resistivity of the created copper contact plugs to the point where it has almost eliminated rejects due to high via resistance failures. The process of the invention will therefore considerably increase the semiconductor device yield.

It must be noted that although the conventional furnace anneal of the deposited copper results in stabilizing the deposited copper, the annealed copper shows (at room temperature) the tendency to "self-anneal". The copper that has been annealed in the conventional manner therefore shows significant variation in the copper removal rate during the process of planarization. This variation in the copper removal rate results in a rough and unpredictable surface of the polished copper, which in turn leads to unpredictable resistivity characteristics of the polished copper via plugs.

After the high-vacuum anneal of the invention has been completed, the excess copper is removed from the surface of the layer of ILD using conventional methods of Chemical Mechanical Polishing (CMP), FIG. 3, step 65. The polishing of the excess copper proceeds down to at least the surface of the deposited layer of ILD and may proceed to slightly lower than this surface in order to eliminate any surface effects of thinning that may exist around corners of either the barrier layer or the seed layer (where these layers exit the opening of the damascene structure). This latter overetch is however not required as part of the present invention and need only be applied if and where this is deemed necessary to avoid uneven thickness of the barrier layer or the seed layer around the upper perimeter of the openings of the damascene structures.

It is clear that the process of the invention can be applied in numerous, different environments where copper as the conductive material of damascene structures. The method of the invention is not dependent on type and application of either the barrier layer or the seed layer and applies equally to dual damascene structures and dual damascene structures. The process of the invention also readily applies to semiconductor devices that have sub-micron device features and is therefore very applicable to future developments of semiconductor devices, in both a copper environment and in a highly miniaturized device environment.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating damascene structures on a surface of a semiconductor, comprising the steps of:

providing a substrate, said substrate having been provided with a pattern of damascene or dual damascene openings having bottoms and sidewalls created on its surface in a layer of Intra Level Dielectric (ILD);

depositing a barrier layer over said layer of ILD, including said bottoms and sidewalls of said damascene openings;

depositing a seed layer over said barrier layer;

depositing a layer of metal over said seed layer;

performing a process of anneal to said deposited layer of metal, said process of anneal being performed at a temperature between about 150 and 250 degrees C., for a duration of between about 40 and 100 seconds, in a high vacuum environment that has a pressure of less than about 1E-5 Torr; and planarizing said layer of metal.

2. The method of claim 1 wherein said metal that is deposited over said seed layer comprises copper.

3. The method of claim 1 wherein said metal that is deposited over said seed layer comprises a copper alloy or any other copper based compound or derivative.

4. The method of claim 1, said barrier layer being deposited using rf. sputtering and comprising a material selected from the group consisting of titanium nitride, tantalum, tungsten, niobium, molybdenum, Ti/TiN and Ti/W, deposited to a thickness within a range of about 100 and 500 Angstrom.

5. The method of claim 1 wherein said seed layer is deposited at a temperature of between about 0 and 300 degrees C. and a pressure of between about 1 and 100 mTorr, using copper or a copper alloy as the source at a flow rate of between about 10 and 400 sccm and using argon as an ambient gas deposited to a thickness between about 25 and 100 Angstrom.

6. The method of claim 1 wherein said depositing a metal over said seed layer uses Electro Chemical Plating (ECP) at a temperature between about 25 and 50 degrees, a source of deposition of $H_2SO_4$ is a dilution of $H_2SO_4$, $CuSO_4$ and HCl with a deposition flow rate of between about 15 K and 20 K sccm and a deposition time of between about 1 and 10 minutes, a voltage of between about 0.1 and 2 volts applied to the anode and the voltage of between about 0.1 and 2 volts applied to the cathode.

7. A method of forming a damascene plug on a surface of a semiconductor substrate, comprising the steps of:

providing a semiconductor substrate;

depositing a first stop layer over the surface of said semiconductor substrate;

depositing a layer of dielectric over said first stop layer;

depositing a second stop layer over said layer of dielectric;

creating an opening having sidewalls and a bottom through said layer of dielectric thereby including said second stop layer;

depositing a barrier layer over said layer of dielectric, including said bottoms and sidewalls of said opening;

depositing a seed layer over said barrier layer;

depositing a layer of metal over said seed layer; performing a process of anneal to said deposited layer of metal, said anneal being performed at a temperature between about 150 and 250 degrees C., for a duration of between about 40 and 100 seconds, in a high vacuum environment that has a pressure of less than about 1E-5 Torr; and planarizing said deposited layer of metal.

8. The method of claim 7 wherein said first and second stop layers comprise SiON and are formed to a thickness of between about 200 and 1000 Angstrom through a CVD method employing silane as a silicon source material and ammonia as a nitrogen source material.

9. The method of claim 7 wherein said layer of dielectric comprises SiO and is deposited using LPCVD, PECVD or APCVD processing at a temperature between about 400 to 800 degrees C. to a thickness between about 5000 and 10000 Angstrom.

10. The method of claim 7 wherein said creating said opening is an anisotropic RIE etch using $CHF_3$ as etchant.

11. The method of claim 7 wherein said metal that is deposited over said seed layer comprises copper.

12. The method of claim 7 wherein said metal that is deposited over said seed layer comprises a copper alloy or any other copper based compound or derivative.

13. The method of claim 7, said barrier layer being deposited using rf. sputtering and comprising a material selected from the group consisting of titanium nitride, tantalum, tungsten, niobium, molybdenum, Ti/TiN and Ti/W, deposited to a thickness within a range of about 100 and 500 angstroms.

14. The method of claim 7 wherein said seed layer is deposited at a temperature of between about 0 and 300 degrees C. and a pressure of between about 1 and 100 mTorr, using copper or a copper alloy as a source at a flow rate of between about 10 and 400 sccm and using argon as an ambient gas deposited to a thickness between about 500 and 2000 Angstrom.

15. The method of claim 7 wherein said depositing a metal over said seed layer uses Electro Chemical Plating (ECP) at a temperature between about 25 and 50 degrees, a source of deposition of $H_2SO_4$ is a dilution of $H_2SO_4$, $CuSO_4$ and HCl with a deposition flow rate of between about 15 K and 20 K sccm and a deposition time of between about 1 and 10 minutes, a voltage of between about 0.1 and 2 volts applied to the anode and the voltage of between about 0.1 and 2 volts applied to the cathode.

16. A method of forming a dual damascene plug on a surface of a semiconductor substrate, comprising the steps of:

providing a semiconductor substrate;

depositing a first stop layer over the surface of said semiconductor substrate;

depositing a first layer of dielectric over said first stop layer;

depositing a second stop layer over said first layer of dielectric;

depositing a second layer of dielectric over said second stop layer;

creating a first opening having sidewalls and a bottom through said first and second layer of dielectric thereby including said second stop layer;

creating a second opening having sidewalls and a bottom through said second layer of dielectric;

depositing a barrier layer over said second layer of dielectric, including said bottoms and sidewalls of said first and second openings;

depositing a seed layer over said barrier layer;

depositing a layer of metal over said seed layer; performing a process of anneal to said deposited layer of metal, said process of anneal being performed at a temperature between about 150 and 250 degrees C., for a duration of between about 40 and 100 seconds, in a high vacuum environment that has a pressure of less than about 1E-5 Torr; and planarizing said layer of metal.

17. The method of claim 16 wherein said first and second stop layers comprise SiON and are formed to a thickness of between about 800 and 1200 Angstrom through a CMP method employing silane as a silicon source material and ammonia as a nitrogen source material.

18. The method of claim 16 wherein said first and second dielectric comprise SiO and are deposited using LPCVD, PECVD or APCVD processing at a temperature between about 400 to 800 degrees C. to a thickness between about 5000 and 10000 Angstrom.

19. The method of claim 16 wherein said creating said first and second openings is an anisotropic RIE etch using $CHF_3$ as etchant.

20. The method of claim 16 wherein said metal that is deposited over said seed layer comprises copper.

21. The method of claim 16 wherein said metal that is deposited over said seed layer comprises a copper alloy or any other copper based compound or derivative.

22. The method of claim 16, said barrier layer being deposited using rf. sputtering and comprising a material selected from the group consisting of titanium nitride, tantalum, tungsten, niobium, molybdenum, Ti/TiN and Ti/W, deposited to a thickness within a range of about 100 and 500 angstroms.

23. The method of claim 16 wherein said seed layer is deposited at a temperature of between about 0 and 300 degrees C. and a pressure of between about 1 and 100 mTorr, using copper or a copper alloy as a source at a flow rate of between about 10 and 400 sccm and using argon as an ambient gas deposited to a thickness between about 500 and 2000 Angstrom.

24. The method of claim 16 wherein said depositing a metal over said seed layer uses Electro Chemical Plating (ECP) at a temperature between about 25 and 50 degrees, a source of deposition of $H_2SO_4$ is a dilution of $H_2SO_4$, $CuSO_4$ and HCl with a deposition flow rate of between about 15 K and 20 K sccm and a deposition time of between about 1 and 10 minutes, a voltage of between about 0.1 and 2 volts applied to the anode and a voltage of between about 0.1 and 2 volts applied to the cathode.

* * * * *